United States Patent
Jeong

(10) Patent No.: US 8,028,121 B2
(45) Date of Patent: Sep. 27, 2011

(54) METHOD AND APPARATUS FOR DETECTING STATIC DATA AREA, WEAR-LEVELING, AND MERGING DATA UNITS IN NONVOLATILE DATA STORAGE DEVICE

(75) Inventor: Seong-hun Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 758 days.

(21) Appl. No.: 11/958,577

(22) Filed: Dec. 18, 2007

(65) Prior Publication Data

US 2008/0147998 A1 Jun. 19, 2008

(30) Foreign Application Priority Data

Dec. 18, 2006 (KR) .................. 10-2006-0129655

(51) Int. Cl.
*G06F 12/02* (2006.01)
*G06F 12/12* (2006.01)
*G11C 11/34* (2006.01)

(52) U.S. Cl. ........ 711/103; 711/156; 711/159; 711/165; 711/E12.084; 365/185.33

(58) Field of Classification Search .................. None
See application file for complete search history.

(56) References Cited

U.S. PATENT DOCUMENTS

| | | | |
|---|---|---|---|
| 6,542,407 B1 | 4/2003 | Chen et al. | |
| 7,096,313 B1 * | 8/2006 | Chang et al. | 711/103 |
| 7,139,863 B1 * | 11/2006 | Defouw et al. | 711/103 |
| 7,320,055 B2 | 1/2008 | Ito et al. | |
| 7,409,492 B2 * | 8/2008 | Tanaka et al. | 711/103 |
| 2002/0184432 A1 | 12/2002 | Ban | |
| 2003/0101327 A1 | 5/2003 | Beck | |
| 2004/0083335 A1 * | 4/2004 | Gonzalez et al. | 711/103 |
| 2005/0114589 A1 * | 5/2005 | Lofgren et al. | 711/103 |
| 2005/0144358 A1 | 6/2005 | Conley | |
| 2005/0286336 A1 | 12/2005 | Harari et al. | |

(Continued)

FOREIGN PATENT DOCUMENTS

CN 1783034 A 6/2006

(Continued)

OTHER PUBLICATIONS

Office Action dated Jun. 29, 2010 from the Japanese Patent Office in counterpart application 2007-323739.

*Primary Examiner* — Pierre-Michel Bataille
*Assistant Examiner* — Ralph A Verderamo, III
(74) *Attorney, Agent, or Firm* — Sughrue Mion, PLLC

(57) ABSTRACT

Provided are a method and apparatus for wear-leveling of a nonvolatile data storage device, whereby a wear-leveling effect is maximized by storing an age value indicating a write time in each data unit of the nonvolatile data storage device and detecting a static data area based on age values. The method includes storing an age value indicating a write time in each unit assigned to write data therein, reading an age value stored in a unit, and determining a static data area based on the read age value. Accordingly, a static data area can be correctly detected without additional overhead, and a wear-leveling effect of the entire storage device can be increased by moving data to and from the static data area, thereby extending the lifespan of the storage device.

25 Claims, 8 Drawing Sheets

U.S. PATENT DOCUMENTS

| | | | |
|---|---|---|---|
| 2006/0106972 A1* | 5/2006 | Gorobets et al. | 711/103 |
| 2006/0161728 A1* | 7/2006 | Bennett et al. | 711/103 |
| 2006/0285397 A1 | 12/2006 | Nishihara et al. | |
| 2007/0033332 A1* | 2/2007 | Sinclair et al. | 711/103 |
| 2007/0208904 A1* | 9/2007 | Hsieh et al. | 711/103 |
| 2007/0260811 A1* | 11/2007 | Merry et al. | 711/103 |
| 2007/0283428 A1* | 12/2007 | Ma et al. | 726/9 |
| 2009/0216938 A1 | 8/2009 | Conley et al. | |

FOREIGN PATENT DOCUMENTS

| | | |
|---|---|---|
| JP | 11-110141 A | 4/1999 |
| JP | 2003-167795 A | 6/2003 |
| JP | 2006-252535 A | 9/2006 |
| JP | 2007-517319 A | 6/2007 |
| KR | 2003-0020435 A | 3/2003 |
| KR | 10-2005-0079991 A | 8/2005 |
| KR | 10-2006-0106993 A | 10/2006 |

* cited by examiner

METHOD AND APPARATUS FOR DETECTING STATIC DATA AREA, WEAR-LEVELING, AND MERGING DATA UNITS IN NONVOLATILE DATA STORAGE DEVICE

CROSS-REFERENCE TO RELATED PATENT APPLICATION

This application claims the benefit of Korean Patent Application No. 10-2006-0129655 filed on Dec. 18, 2006, in the Korean Intellectual Property Office, the disclosure of which is incorporated herein in its entirety by reference.

BACKGROUND OF THE INVENTION

1. Field of the Invention

The present invention relates to a wear-leveling method, and more particularly, to a method and apparatus for wear-leveling of a nonvolatile data storage device, whereby a wear-leveling effect is maximized by storing an age value indicating a write time in each data unit of the nonvolatile data storage device and detecting a static data area by using age values.

2. Description of the Related Art

Recently, flash memories, which are a kind of nonvolatile data storage device used in various multimedia devices including mobile devices, are being widely used as a preferred storage device due to characteristics of flash memories, such as low power consumption, small size, low heat production and high stability, and also due to the rapidly increasing storage size of a single flash memory.

However, in general, flash memories have a slow programming (write) speed, and, in order to update a block in which data is recorded, the block must be erased before a write operation is performed with respect to the block.

Every block that constitutes a basic unit of an erase operation can endure a number of erase counts, termed the endurance condition. For example, 100,000 erase counts for a Single Level Cell (SLC) type and 10,000 erase counts for a Multiple Level Cell (MLC) type. The endurance condition is also applied to other nonvolatile data storage devices in which write and erase operations can be performed, and thus, the description below can be generally applied to all nonvolatile data storage devices.

If frequent update occurs in a specific block of a memory, a bad block may be generated due to an aging process, resulting in a rapid decrease of lifespan of the entire memory. In order to prevent the aging process, a file system which is used to manage flash memories, such as Flash Translation Layer (FTL) system, requires a wear-leveling scheme, and a lifespan of a memory significantly depends on a wear-leveling method employed.

FIG. 1 is a graph showing the number of erase counts per block of a flash memory when using a counting runtime only method according to the prior art.

A wear-leveling method used to manage the number of erase counts generally uses a method of storing the number of erase counts per block, which can be divided into two methods. A first method is a method in which a management table containing information on the number of erase counts is stored in the flash memory, and a second method is a method in which the management table containing information on the number of erase counts is stored in a memory (Random Access Memory (RAM)) of a system driving the flash memory. The above described second method is the counting runtime only method.

According to the first method (stored in the flash memory), the number of erase counts with a physical block address of the flash memory is stored in a block map table included in the flash memory, and only a map table cache is stored in the system memory. Thus, since the number of erase counts per block is stored in the flash memory, correct wear-leveling of the flash memory can be performed, however, computational overheads of the block map table become twice as large due to the additional information on the number of erase counts.

According to the second method (the counting runtime only method), only the physical block address is stored in the block map table included in the flash memory, and the information on the number of erase counts is stored and managed in the system memory in a form of an erase count array. Since the information on the number of erase counts is reset when power of the system is turned off, it is difficult to perform ideal wear-leveling of the flash memory, however, no computational overhead is required to update the block map table included in the flash memory.

Referring to FIG. 1, when the second method (the counting runtime only method) in which there is no computational overhead is used, the number of erase counts is shown generally even due to the wear-leveling method by means of management of the number of erase counts, address re-mapping and garbage collection functions basically operated by the FTL.

Referring to block numbers 0 to 749, it can be seen that differences between erase counts per block are not very large.

However, referring to block numbers 749 to 953 (referred to as reference numeral 110), the number of erase counts per block is very small, and thus, a difference of the number of erase counts between the blocks of the block numbers 749 to 953 and other surrounding blocks is very large. The area 110 is a static data area in which data is secured for a long time without being updated or erased. When the second method is used, it is difficult to exactly detect the static data area 110 due to resetting of information on the number of erase counts.

In a wear-leveling method using the second method (the counting runtime only method), since information regarding wear (information on the number of erase counts) is reset when power of a system is turned off, if the static data area 110 is widely distributed throughout the storage device a wear-leveling effect is considerably decreased.

FIG. 2 is a flowchart for describing a wear-leveling method with respect to static areas in a flash memory according to the prior art.

Referring to FIG. 2, in the wear-leveling method with respect to static areas according to the prior art, a number of write or erase operations is counted in operation 210, and when a counting value is a multiple number of a selected number, e.g. 1000, a random process is activated in operation 220, and the wear-leveling method begins in operation 230. By setting a specific selection order in operation 240 or activating a random process in operation 250, a unit is selected in operation 260, data of the selected unit is moved to another free unit in operation 270, and the selected unit is erased.

However, according to the wear-leveling method, since movement or swapping of blocks occurs with respect to the entire flash memory using a random function, swapping of blocks which are not in a static data area occurs frequently. That is, since swapping between free units or swapping of blocks frequently updated occurs and an unnecessary erase operation accompanying the swapping occurs additionally, the lifespan of the entire flash memory is reduced.

SUMMARY OF THE INVENTION

The present invention provides a wear-leveling method and apparatus, whereby a wear-leveling effect is maximized by storing an age value indicating a write time in each data unit of the nonvolatile data storage device and accurately detecting a static data area.

According to an aspect of the present invention, there is provided a method of detecting a static data area in a nonvolatile data storage device, the method comprising: storing an age value indicating a write time in each unit assigned to write data therein; reading an age value stored in a unit; and determining whether the unit is a static data area based on the read age value.

The age value may indicate a relative order when the data was written.

The storing of the age value may comprise storing an age value when the data is written after each unit is erased, and the age value may be stored in a spare area of each unit.

The age value may be recorded by at least one age counter existing in the nonvolatile data storage device, the age counter may have an age counter value and change its age counter value every time a free unit in which no data is recorded is assigned, and the age counter value may be changed by being sequentially increased.

The age counter value may be recorded in a spare area of a mapping table with respect to an assigned free unit and stored when the mapping table is updated.

The age value stored may be the same as the age counter value of when the data stored together with the age value was recorded.

The nonvolatile data storage device may be a flash memory, each unit may be a data block, the spare area in which the age value is stored may be a spare area of a first page of the data block, and one age value per data block may exist.

The reading of the age value stored in the unit may be performed during an idle time of a system driving the nonvolatile data storage device, and the reading of the age value stored in the unit may be sequentially performed with respect to all units to which data is assigned.

The determining of whether the unit is a static data area based on the read age value may further comprise comparing the read age value and the age counter value, and the comparing of the read age value and the age counter value may comprise comparing the read age value and the age counter value and if a difference between the read age value and the age counter value is greater than a predetermined threshold, determining the unit having the read age value as being a static data area.

According to another aspect of the present invention, there is provided a wear-leveling method in a nonvolatile data storage device, the method comprising: storing an age value indicating a write time in each unit assigned to have data written therein; reading an age value stored in a unit; determining whether the unit is a static data area based on the read age value; and moving data in the unit determined as a static data area to another unit.

The age value may indicate a relative order of when the data was written, the storing of the age value may comprise storing an age value when the data is recorded, and the age value may be stored in a spare area of each unit.

The age value may be recorded by at least one age counter existing in the nonvolatile data storage device, and the age counter may have an age counter value and change its age counter value every time a free unit in which no data is recorded is assigned.

The reading of the stored age value may be performed during an idle time of a system driving the nonvolatile data storage device and sequentially performed with respect to all units to which the data is assigned.

The determining of whether the unit is a static data area based on the read age value may further comprise comparing the read age value and the age counter value, wherein, as a result of the comparison, if a difference between the read age value and the age counter value is greater than a predetermined threshold, the unit having the read age value is detected as being a static data area.

The moving of the data in the unit determined as a static data area to another unit may comprise moving the data of the unit determined as a static data area to a free unit in which no data is recorded, and the method may further comprise updating an age value of the unit in which the moved data has been moved to.

The moving of the data in the unit determined as a static data area to another unit may comprise swapping the data of the unit determined as a static data area with the data of another unit in which other data is recorded, another unit in which other data is recorded may have an age value greater than that of the unit determined as a static data area, and the method may further comprise updating age values of the units in which the swapped data has been recorded.

The moving of the data in the unit determined as a static data area to another unit may be performed during the idle time of the system driving the nonvolatile data storage device.

According to another aspect of the present invention, there is provided a method of merging data units in a nonvolatile data storage device, the method comprising: storing an age value indicating a write time in each unit assigned to have data written therein; reading the stored age values; detecting a plurality of units to be merged based on the read age values; and merging the plurality of units.

The age value may indicate a relative order when the data was recorded, the storing of the age value may comprise storing an age value when the data is recorded, and the age value may be stored in a spare area of each unit.

The age value may be recorded by at least one age counter existing in the nonvolatile data storage device, wherein the age counter has an age counter value and changes its age counter value every time a free unit in which no data is recorded is assigned.

The reading of the stored age values may be performed during an idle time of a system driving the nonvolatile data storage device and sequentially performed with respect to all units to which the data is assigned.

The detecting of the plurality of units to be merged by means of the read age values may further comprise comparing each of the read age values and the age counter value, wherein, as a result of the comparison, if a difference between each of the read age values and the age counter value is greater than a predetermined threshold, the unit having the read age value is detected as a unit to be merged.

The reading of the stored age values may further comprise calculating a mean value of age values of a plurality of data units with respect to a logical basic unit recognized by the system.

The detecting of the plurality of units to be merged based on the read age values may comprise detecting a plurality of data units having the lowest mean age value as units to be merged.

The detecting of the plurality of units to be merged based on the read age values may further comprise calculating computational overheads and benefits accompanying the merge, wherein the computational overheads correspond to the amount of data to be moved according to the merge and the calculated mean age value, and the benefits correspond to the amount of dirty data to be collected in a free unit due to the merge.

The detecting of the plurality of units to be merged based on the read age values may further comprise calculating priority values inversely proportional to the calculated computational overheads and proportional to the calculated benefits, wherein a plurality of data units having the highest priority value are detected as units to be merged.

According to another aspect of the present invention, there is provided an apparatus for detecting a static data area in a nonvolatile data storage device, the apparatus comprising: an age recorder storing an age value indicating a write time in each unit assigned to have data written therein; an age reader reading an age value stored in a unit; and a static data determiner determining a static data area based on the read age value.

According to another aspect of the present invention, there is provided a wear-leveling apparatus in a nonvolatile data storage device, the apparatus comprising: an age recorder storing an age value indicating a write time in each unit assigned to data written therein; an age reader reading a stored age value; a static data detector detecting a static data area based on the read age value; and a data unit transformer moving data in the detected static data area to another unit.

According to another aspect of the present invention, there is provided an apparatus for merging data units in a nonvolatile data storage device, the apparatus comprising: an age recorder storing an age value indicating a write time in each unit assigned to data written therein; an age reader reading the stored age values; a merge object search unit detecting a plurality of units to be merged based on the read age values; and a merge unit merging the plurality of detected units.

According to another aspect of the present invention, there is provided a computer readable recording medium storing a computer readable program for executing the static data area detecting method, the wear-leveling method, or the data unit merging method.

BRIEF DESCRIPTION OF THE DRAWINGS

The above and other features and advantages of the embodiments of the present invention will become more apparent by describing in detail exemplary embodiments thereof with reference to the attached drawings in which.

DETAILED DESCRIPTION OF THE INVENTION

Hereinafter, preferred embodiments of the present invention will be explained in detail with reference to the attached drawings. Although a flash memory is described hereinafter, the description can be applied to all nonvolatile data storage devices.

Figure 1:
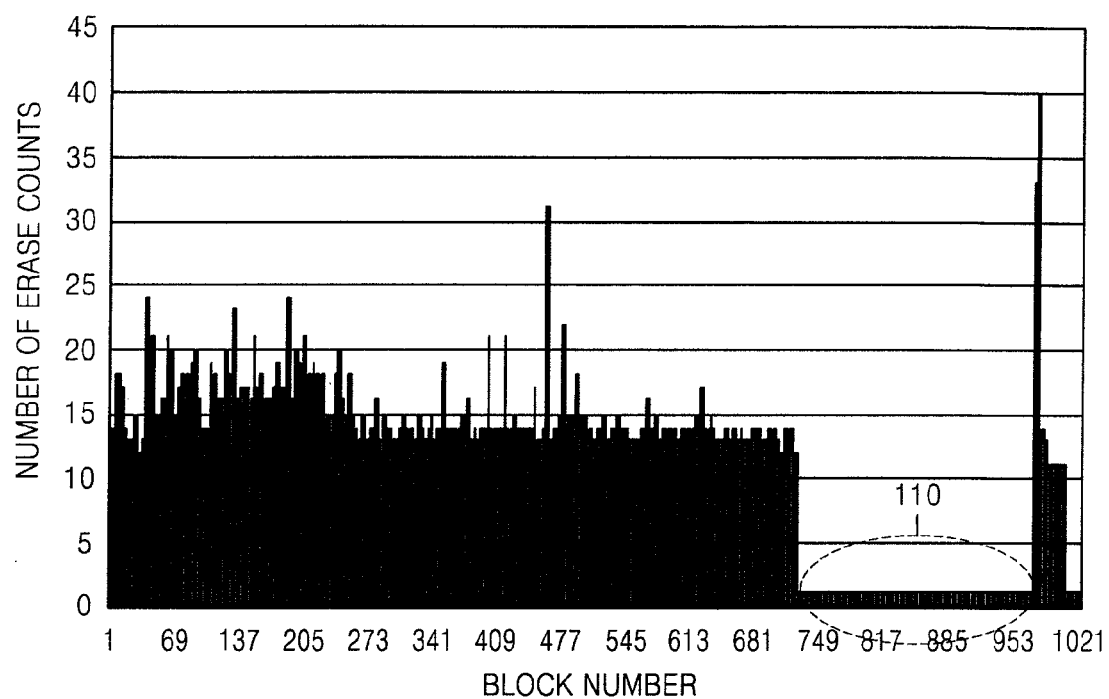
FIG. 1 is a graph showing the number of erase counts per block of a flash memory by means of a counting runtime only method according to the prior art.
Figure 2:
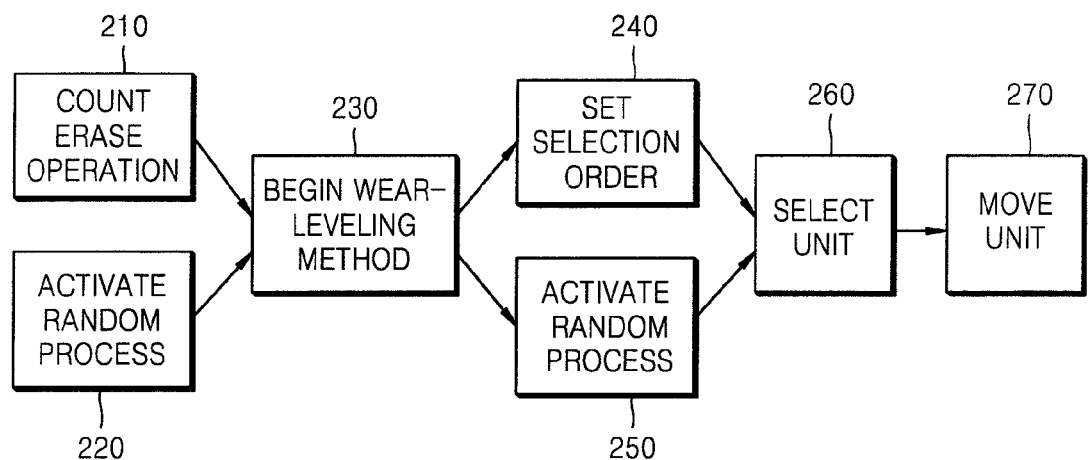
FIG. 2 is a flowchart for describing a wear-leveling method with respect to static areas in a flash memory according to the prior art.
Figure 3:
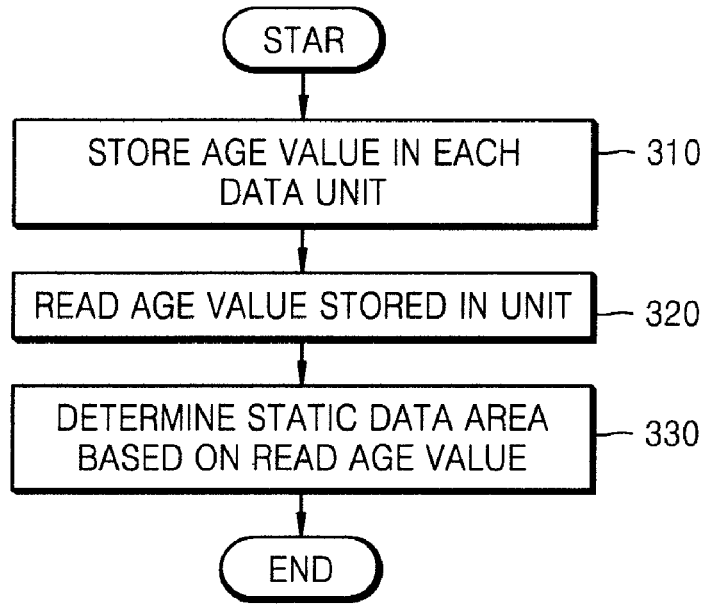
FIG. 3 is a flowchart of a method of detecting a static data area in a nonvolatile data storage device according to an embodiment of the present invention.

FIG. 3 is a flowchart of a method of detecting a static data area in a nonvolatile data storage device according to an embodiment of the present invention.

Referring to FIG. 3, an age value is stored in each data unit in operation 310. The data unit may be a data block of a flash memory.

The age value is a parameter indicating a write time, and one age value per data block is stored every time data is recorded with respect to all data blocks. That is, when data is recorded in a first page of a data block, an age value can be recorded in a spare area of the first page. Each page of a data block has a 16 or 64-byte spare area to record Error Correction Code (ECC) information and the like therein. Since an age value to be stored has an integer size, the age value can use a part of the spare area. The age value indicating a write time indicates a relative write order between data blocks instead of an absolute time. Each age value is recorded by at least one age counter existing in a nonvolatile data storage device such as a flash memory, wherein an age counter value indicating when data is stored is recorded as an age value. The age counter changes its value every time a free unit in which no data is recorded, such as a free block, is assigned. For example, if the age counter value is sequentially increased by 1, in the case of a data block having an age value of 20 and a data block having an age value of 21, the former was recorded relatively earlier than the latter. As described above, age values indicate the relative write order of data blocks. Importantly, since an age value is stored when data is recorded in a data block after the data block is erased, if an age value is relatively smaller, then a data block having the age value was erased earlier. In addition, since a mapping table is always updated when a free block is assigned, an age counter value can be recorded in a spare area of a relevant page of the mapping table when the mapping table is updated. Thus, there is no additional computational overhead to operate age values and the age counter, and the nonvolatile data storage device can always maintain write time information called "age" regardless of if the power is on or off.

An age value stored in a data block is read in operation 320. The operation of reading a stored age value is performed during an idle time of a system and sequentially performed with respect to all data blocks to which data is assigned.

A static data area is determined based on the read age value in operation 330, which will be described in detail with reference to FIG. 4.

Figure 4:
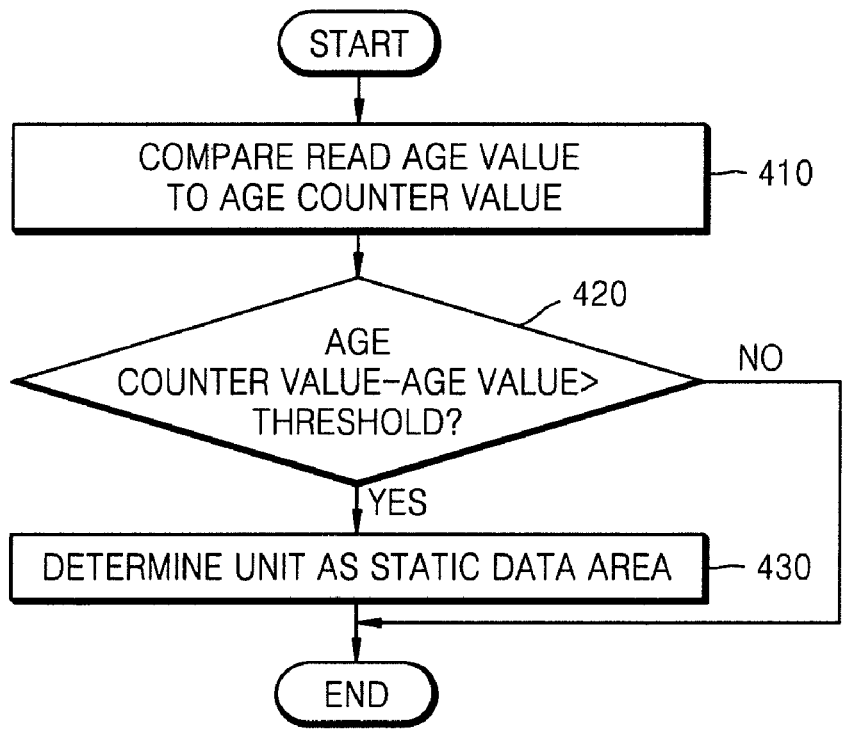
FIG. 4 is a flowchart of a process of determining a static data area by means of a read age value, which is illustrated in FIG. 3, according to an embodiment of the present invention.

FIG. 4 is a flowchart of operation 330 illustrated in FIG. 3, according to an embodiment of the present invention.

Referring to FIG. 4, in order to determine a static data area, the read age value is compared to a current age counter value in operation 410. Since an age value is a representative value of a time at which data is recorded in a relevant data block, the age value is compared to the current age counter value. This is because since an age counter value is increased every time a free block is assigned, a relative write time can be determined by comparing the age counter value to an age value of a selected data block.

Thus, if a result obtained by subtracting the read age value from the current age counter value is greater than a predetermined threshold in operation 420, this means that data was recorded in the data block having the read age value a relatively long time ago and has not been updated. The predetermined threshold can be determined according to the purpose of a memory storage device by a system designer or may be determined as a value deriving the most optimal performance.

Thus, if the result obtained by subtracting the read age value from the current age counter value is greater than the predetermined threshold, the data block having the age value can be determined as a static data area in operation 430.

Figure 5:
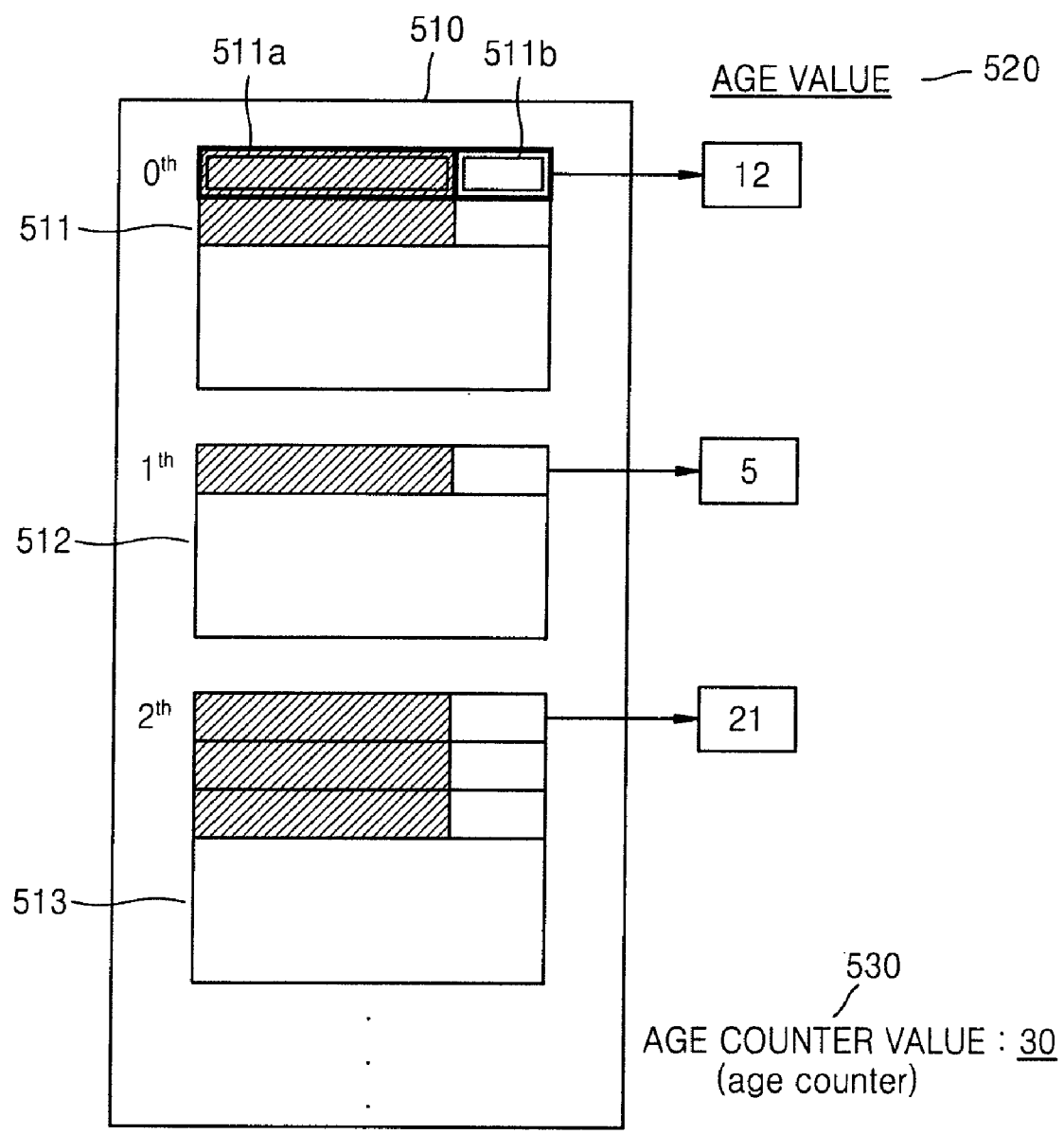
FIG. 5 illustrates an age value per data unit and an age counter value according to an embodiment of the present invention.

FIG. 5 illustrates an example of using age value in a flash memory according to an embodiment of the present invention.

Referring to FIG. 5, correlations between age values and an age counter value illustrated in FIG. 5 will now be described. A flash memory 510, which is a nonvolatile data storage device, and $0^{th}$ to $2^{nd}$ physical data blocks 511, 512, and 513, which correspond to blank units, are shown. Taking the $0^{th}$ data block as a representative example of the data blocks, a first page includes a data area 511a and a spare area 511b. As described above, an age value 520 of the $0^{th}$ data block is stored in the spare area 511b and in this case is 12. In the case of other data blocks, an age value 520 of the $1^{st}$ data block 512 is 5, and an age value 520 of the $2^{nd}$ data block 513 is 21. Since a current age counter value 530 is 30, by comparing the current age counter value 530 to the $1^{st}$ data block 512 having the smallest age value, it can be known that 25 (=30−5) free blocks have been additionally assigned since the $1^{st}$ data block 512 was assigned. Since the $1^{st}$ data block 512 has not been erased, the $1^{st}$ data block 512 can be determined as a relatively static data area.

Figure 6:
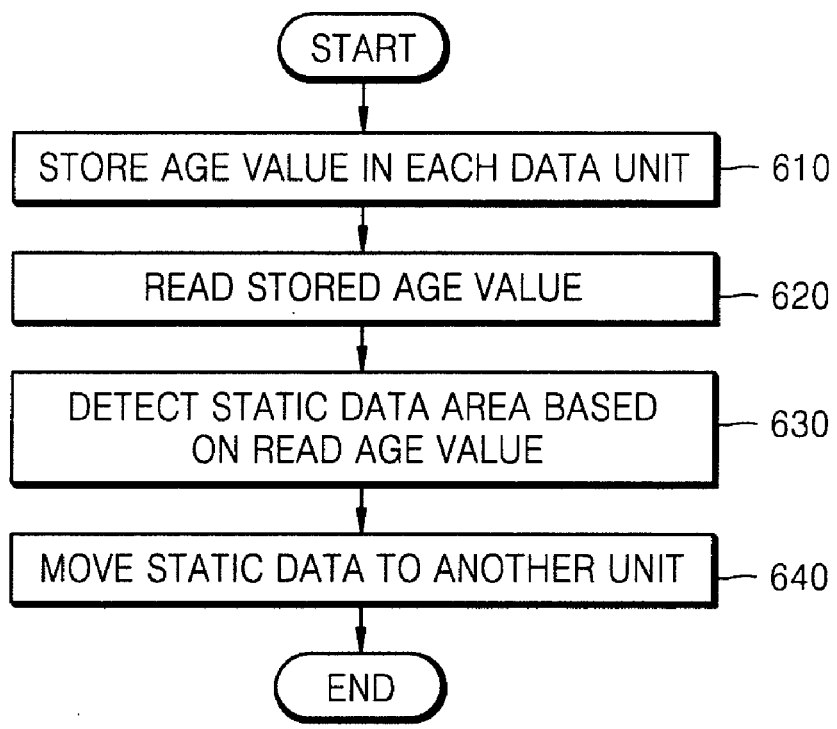
FIG. 6 is a flowchart of a wear-leveling method in a nonvolatile data storage device according to another embodiment of the present invention.
Figure 7:
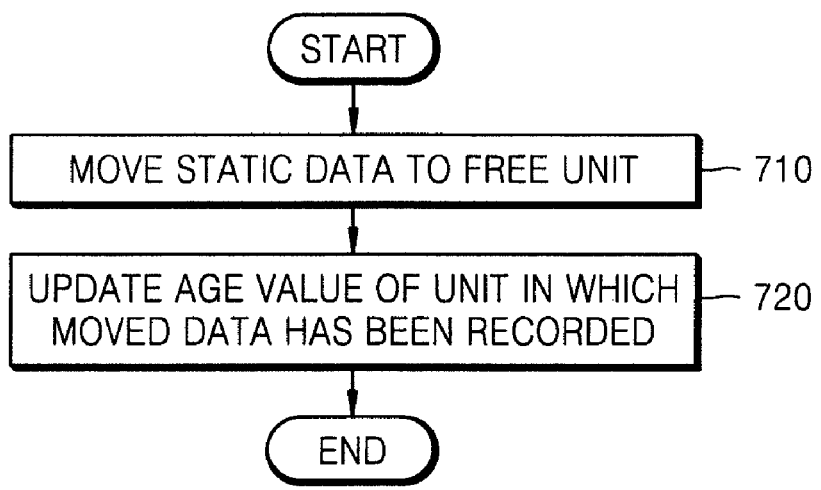
FIG. 7 is a flowchart of a process of moving static data to another unit, which is illustrated in FIG. 6, according to an embodiment of the present invention.
Figure 8:
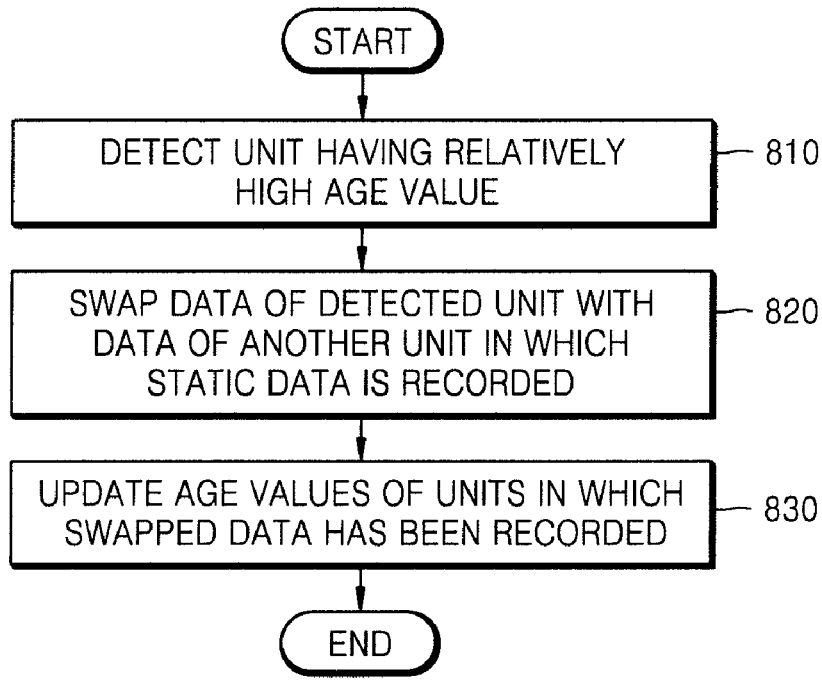
FIG. 8 is a flowchart of a process of moving static data to another unit, which is illustrated in FIG. 6, according to another embodiment of the present invention.

FIG. 6 is a flowchart of a wear-leveling method in a nonvolatile data storage device according to another embodiment of the present invention, and FIGS. 7 and 8 are flowcharts of operation 640 illustrated in FIG. 6.

Referring to FIGS. 6, 7, and 8, the operations 610, 620 and 630 of storing an age value indicating a write time in each unit (data block) assigned to record data therein (referred to as 610), reading a stored age value (referred to as 620) and detecting a static data area by means of the read age value (referred to as 630) are the same as operations 310, 320, and 330 illustrated in FIG. 3.

Data in the detected static data area is moved to another data block in operation 640 using one of two methods.

According to a first method, the static data is moved to a free block in operation 710. Since a data block detected as the static data area is a data block that has not been updated or erased for a long time, by moving the static data to a free block and designating the data block, which had the static data, as a new free block, the data block designated as a new free block can be used as a free block to be newly assigned in a next update, and thus, erase and write operations will occur more frequently with respect to the data block designated as a new free block. As described above, in operation 720, since a new age value (a current age counter value) is updated and stored in a spare area of a first page of the data block to which the static data is moved, which was initially a free block, the data stored in the data block to which the static data is moved will not be moved again until the data is detected as static data (of course, if the data block continuously remains as a static data area, the static data in the data block will be moved to a free block again).

According to a second method, data of the static data area and data of another data block that has not been determined as a static data area are swapped. To do the swapping, a data block having an age value relatively greater than that of the data block in which the static data is recorded is detected in operation 810. In operation 820, the data of the detected data block is swapped with the data of the data block in which the static data is recorded. In operation 830, age values of the data blocks in which the swapped data has been recorded are updated. Data of a data block determined and detected as a data block having static data is swapped with data of a data block having a relatively greater age value since it is known that the data block having a relatively greater age value has been updated lately. Since this means that the probability of updating data in the data block having a relatively greater age value again is high, wear-leveling can be achieved by the swapping. This is because frequent updating causes garbage collection operations to be more frequent, resulting in more designations of free blocks, thereby allowing repeat erase and write operations with respect to the free block.

The operation of detecting a static data area and moving or swapping detected static data can be performed during an idle time of a system, and the first and second methods can be selectively applied as specified by a system designer.

Figure 9:
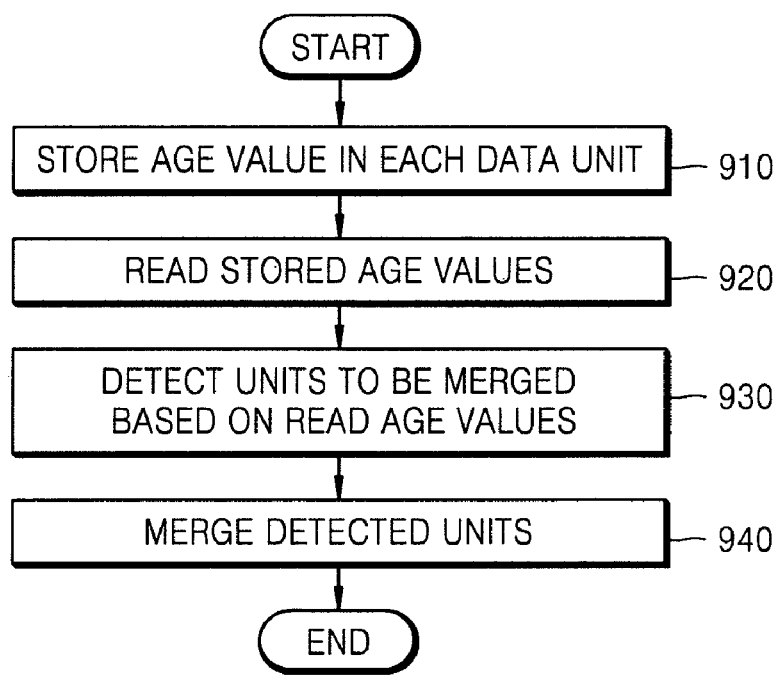
FIG. 9 is a flowchart of a method of merging data units in a nonvolatile data storage device according to another embodiment of the present invention.

FIG. 9 is a flowchart of a method of merging data units in a nonvolatile data storage device according to another embodiment of the present invention.

In a flash memory storage device, a single logical data block is distributed and stored in a plurality of physical data blocks by using a frequent update operation. In this case, a merge operation is generally used as a method of generating a free block by collecting unused areas due to update (invalid pages). That is, the merge operation provides a method of collecting data distributed and stored in a plurality of data blocks into a single data block, changing the plurality of data blocks into as free blocks, and reusing the free blocks.

Referring to FIG. 9, the method includes storing an age value indicating a write time in each unit assigned to write data therein (operation 910), reading the stored age values (operation 920) detecting a plurality of units to be merged by means of the read age values (operation 930), and merging the plurality of units (operation 940).

That is, when data blocks to be merged are detected, data blocks in which static data is stored are selected. Thus, data blocks in static data areas are collected as free blocks by means of the merge operation, causing erase and write operations in the collected free blocks in a next update operation, thereby achieving the wear leveling.

Figure 10:
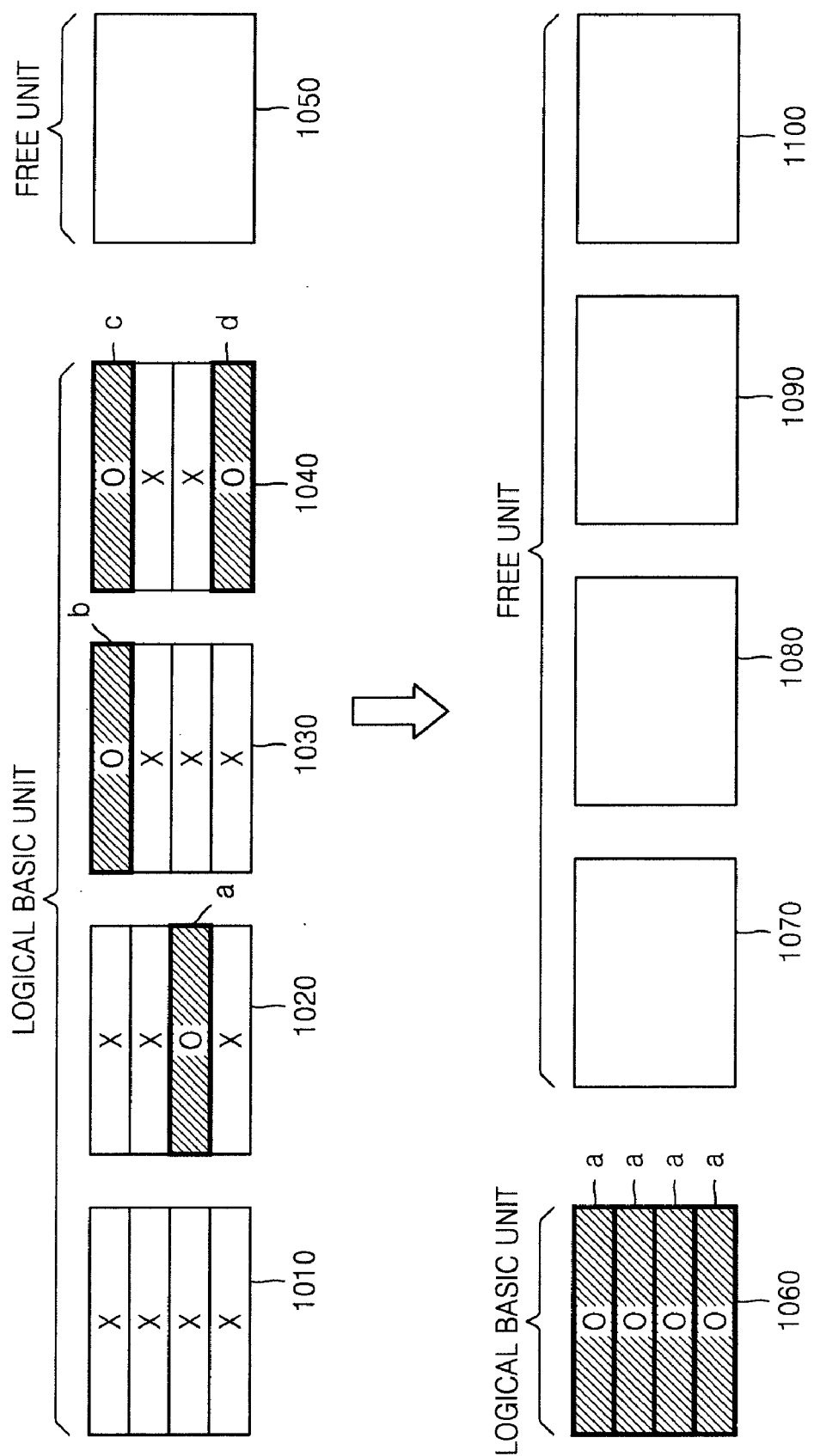
FIG. 10 illustrates a data unit merging process according to another embodiment of the present invention.

FIG. 10 illustrates a data unit merging process according to another embodiment of the present invention.

Referring to FIG. 10, a logical basic unit (4 data blocks 1010, 1020, 1030, and 1040) is illustrated. It is assumed that each data block has 4 pages. The first data block 1010 has 4 invalid pages, the second and third data blocks 1020 and 1030 have only one valid page, and the fourth data block 1040 has 2 valid pages and 2 invalid pages. Since the logical basic unit has been written and does not have any clean pages, in a next update, a merge operation of the 4 data blocks 1010, 1020, 1030, and 1040 is performed first of all. Thus, by collecting (copyback) the 4 valid pages into a free block 1050, a valid block 1060 and 4 free blocks 1070, 1080, 1090, and 1100 are generated.

Figure 11:
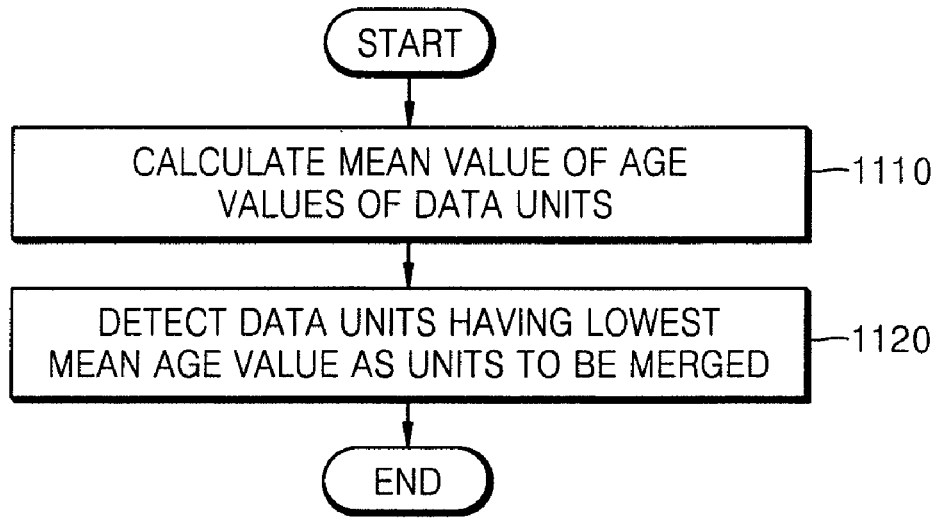
FIG. 11 is a flowchart of a process of reading a stored age value and detecting units to be merged based on the read age value, which is illustrated in FIG. 9, according to an embodiment of the present invention.
Figure 12:
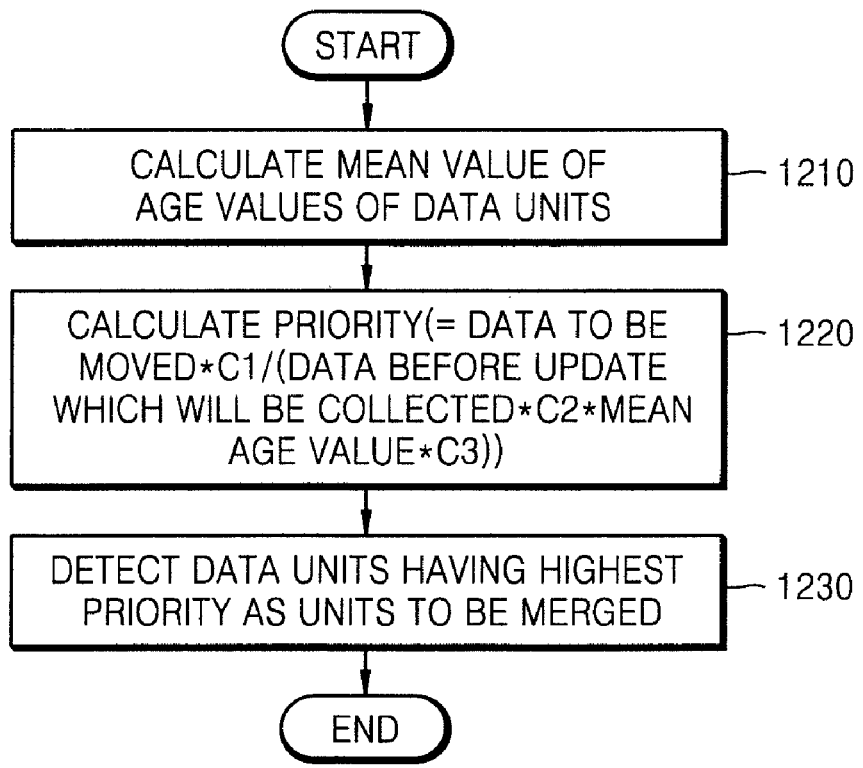
FIG. 12 is a flowchart of a process of reading a stored age value and detecting units to be merged based on the read age value, which is illustrated in FIG. 9, according to another embodiment of the present invention.

FIGS. 11 and 12 are flowcharts of operations 920 and 930 illustrated in FIG. 9.

The merge operation illustrated in FIG. 10 can be performed by applying one of two methods using static data areas.

A first method is a method of calculating a mean value of age values of each group of a plurality of data blocks, each group constituting a logical basic unit, and selecting data blocks having the lowest mean value to be merged. That is, since when a mean age value is relatively lower than those of other logical basic units the data is determined to be static data, generating free blocks by selecting the static data to be merged achieves the purpose of wear-leveling according to the current embodiment. Thus, a mean value of age values of data units with respect to a logical basic unit recognized by a system is calculated in operation 1110, and data units having the lowest mean value are detected as units to be merged in operation 1120.

A second method is a method of considering computational overheads and benefits to be able to write bulk data at a high speed. Schematically, the second method includes calculating a mean value of age values of data units with respect to a logical basic unit (operation 1210), considering priorities (operation 1220), and detecting data blocks to be merged based on the priorities (operation 1230).

One purpose of the merge operation is to collect a plurality of free blocks. Thus, the merge operation achieves the wear-leveling by merging data blocks in static data areas and simultaneously obtaining more benefits with lower computational overheads. The computational overheads correspond to the amount of data (valid data) to be moved due to the merge operation, and the computational overheads correspond to data before update is performed, to be collected to a free block as a result of the merge operation, i.e., dirty or invalid data. As described above, if data units have a lower mean age value, the data units are more suitable to be merged, and thus the mean age value can be considered when calculating computational overheads. By selecting constant values C1, C2, and C3 to be inversely proportional to the computational overheads and proportional to the benefits, priority can be calculated using Formula 1.

$$\text{priority} = \text{data to be moved} * C1 / (\text{invalid data to be collected} * C2 * \text{mean value of age values} * C3) \quad (1)$$

Thus, if data blocks have higher priority, the data blocks have a higher ratio of benefits to computational overheads, and thus the data blocks having the higher priority are selected as data blocks to be merged. The constants C1 and C3 can be selected according to the purpose of a system by a system designer or may be determined as values showing the highest performance by means of experiments.

Figure 13:
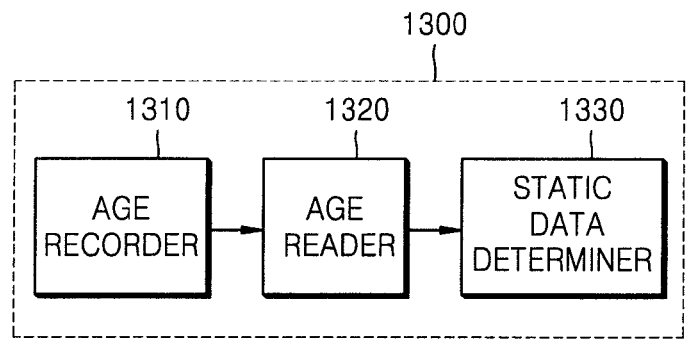
FIG. 13 is a block diagram of an apparatus for detecting a static data area in a nonvolatile data storage device according to another embodiment of the present invention.

FIG. 13 is a block diagram of an apparatus 1300 for detecting a static data area in a nonvolatile data storage device according to another embodiment of the present invention.

Referring to FIG. 13, the apparatus 1300 includes an age recorder 1310 storing an age value indicating a write time in each unit assigned to have data written therein, an age reader 1320 reading an age value stored in a unit, and a static data determiner 1330 determining a static data area by means of a read age value.

Figure 14:
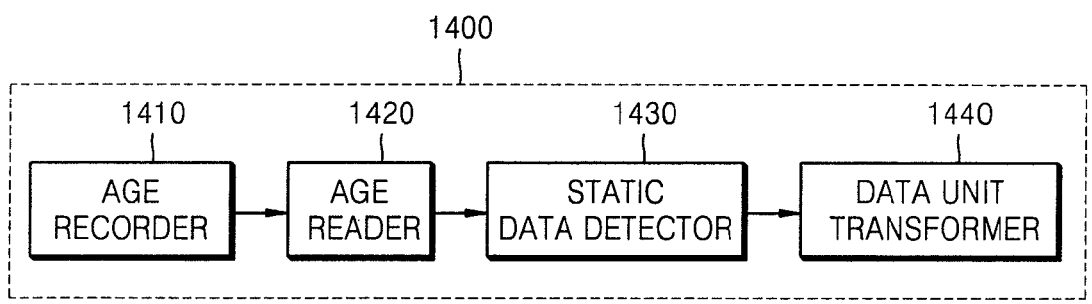
FIG. 14 is a block diagram of a wear-leveling apparatus in a nonvolatile data storage device according to another embodiment of the present invention.

FIG. 14 is a block diagram of a wear-leveling apparatus 1400 in a nonvolatile data storage device according to another embodiment of the present invention.

Referring to FIG. 14, the wear-leveling apparatus 1400 includes an age recorder 1410 storing an age value indicating a write time in each unit assigned to have data written therein, an age reader 1420 reading a stored age value, a static data detector 1430 detecting a static data area by means of a read age value, and a data unit transformer 1440 moving data in a detected static data area to another unit.

Figure 15:
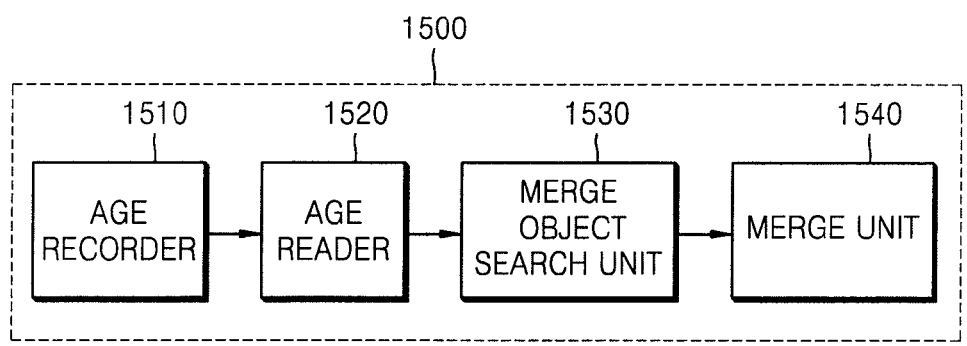
FIG. 15 is a block diagram of an apparatus for merging data units in a nonvolatile data storage device according to another embodiment of the present invention.

FIG. 15 is a block diagram of an apparatus 1500 for merging data units in a nonvolatile data storage device according to another embodiment of the present invention.

Referring to FIG. 15, the apparatus 1500 includes an age recorder 1510 storing an age value indicating a write time in each unit assigned to have data written therein, an age reader 1520 reading stored age values, a merge object search unit 1530 detecting a plurality of units to be merged by means of read age values, and a merge unit 1540 merging the plurality of detected units.

The method of detecting a static data area, the wear-leveling method, and the method of merging data units according to an embodiment of the present invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

As described above, according to a wear-leveling method in a nonvolatile data storage device according to an embodiment of the present invention, since a static data area is detected using an age value stored in each data unit, data can be swapped by detecting static data areas more appropriately than the existing methods. In addition, according to a method of merging data units, by adding a static data area as a factor variable when units to be merged are selected, the probability of selecting static data as data to be merged can be increased. Accordingly, a static data area can be correctly detected without additional computational overheads, and a wear-leveling effect of the entire storage device can be increased by moving data to and from the static data area, thereby extending the lifespan of the storage device.

While this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A method, comprising:
   detecting a static data area in a nonvolatile data storage device, the detecting comprising:
   storing an age value which indicates a write time in each unit assigned to write data therein;
   reading an age value stored in a unit; and
   determining whether the unit is a static data area based on the read age value,
   wherein the determining whether the unit is a static data area comprises comparing the read age value with an age counter value which is incremented every time a free unit in which no data is recorded, is assigned, and
   wherein the age value stored is the same as the age counter value of when the data stored together with the age value was recorded.

2. The method of claim 1, wherein the age value indicates a relative order of when the data was written.

3. The method of claim 2, wherein the storing of the age value comprises storing the age value in a spare area of each unit.

4. The method of claim 3, wherein the age value is recorded by at least one age counter existing in the nonvolatile data storage device.

5. The method of claim 4, wherein the age counter has the age counter value.

6. The method of claim 5, wherein the age counter value is recorded in a spare area of a mapping table with respect to an assigned free unit and stored when the mapping table is updated.

7. The method of claim 2, wherein the reading of the age value stored in the unit is performed during an idle time of a system which drives the nonvolatile data storage device.

8. The method of claim 7, wherein the reading of the age value stored in the unit is sequentially performed with respect to all units to which data is assigned.

9. The method of claim 8, wherein the comparing of the read age value and the age counter value comprises comparing the read age value and the age counter value and if a difference between the read age value and the age counter value is greater than a predetermined threshold, determining the unit which has the read age value as being a static data area.

10. The method of claim 1, further comprising wear-leveling by moving data in the unit determined as a static data area to another unit.

11. The method of claim 10, wherein the age value is recorded by at least one age counter existing in the nonvolatile data storage device, and the age counter has the age counter value.

12. The method of claim 11, wherein the comparing of the read age value and the age counter value comprises comparing the read age value and the age counter value and if a difference between the read age value and the age counter value is greater than a predetermined threshold, determining the unit which has the read age value as being a static data area.

13. The method of claim 10, wherein the moving of the data in the unit determined as a static data area to another unit comprises swapping the data of the unit determined as a static data area with the data of another unit in which other data is recorded.

14. The method of claim 1, wherein the age value is a parameter indicating a number of times data is recorded in the respective unit, wherein the unit is a data block, and wherein the age value is maintained without reset when the nonvolatile data storage device is turned off and turned on.

15. A method of merging data units in a nonvolatile data storage device, the method comprising:
    storing an age value which indicates a write time in each unit assigned to have data written therein;
    reading the stored age values;
    detecting a plurality of units to be merged based on the read age values; and
    merging the plurality of units.

16. The method of claim 15, wherein the age value is recorded by at least one age counter which exists in the nonvolatile data storage device,
    wherein the age counter has an age counter value.

17. The method of claim 16, wherein the reading of the stored age values is performed during an idle time of a system which drives the nonvolatile data storage device and sequentially performed with respect to all units to which the data is assigned.

18. The method of claim 17, wherein the comparing each of the read age value and the age counter value comprises comparing each the read age values and the age counter value and if a difference between each of the read age values and the age counter value is greater than a predetermined threshold, the unit which has the read age value is detected as a unit to be merged.

19. The method of claim 17, wherein the reading of the stored age values further comprises calculating a mean value of age values of a plurality of data units with respect to a logical basic unit recognized by the system.

20. The method of claim 19, wherein the detecting of the plurality of units to be merged based on the read age values further comprises calculating computational overheads and benefits which accompany the merge,
    wherein the computational overheads correspond to the amount of data to be moved during the merge and the calculated mean age value, and the benefits correspond to the amount of dirty data to be collected in a free unit due to the merge.

21. The method of claim 20, wherein the detecting of the plurality of units to be merged based on the read age values further comprises calculating priority values inversely proportional to the calculated computational overheads and proportional to the calculated benefits,
    wherein a plurality of data units which have the highest priority value are detected as units to be merged.

22. An apparatus comprising:
    an age recorder which stores an age value indicating a write time in each unit assigned to have data written therein;
    an age reader which reads an age value stored in a unit; and
    a static data determiner which determines a static data area based on the read age value,
    the static data determiner compares the read age value with an age counter value which is incremented every time a free unit in which no data is recorded, is assigned,
    wherein the age value stored is the same as the age counter value of when the data stored together with the age value was recorded.

23. The apparatus of claim 22, further comprising:
    a static data detector which detects a static data area based on the read age value; and
    a wear-leveling data unit transformer which moves data in the detected static data area to another unit.

24. An apparatus for merging data units in a nonvolatile data storage device, the apparatus comprising:
    an age recorder which stores an age value indicating a write time in each unit assigned to have data written therein;

an age reader which reads the stored age values;

a merge object search unit which detects a plurality of units to be merged based on the read age values; and a merge unit which merges the plurality of detected units.

25. A computer readable recording medium storing a computer readable program for executing a method comprising:

storing an age value which indicates a write time in each unit assigned to write data therein;

reading an age value stored in a unit; and determining whether the unit is a static data area based on the read age value, wherein the determining unit is a static data area comprises comparing the read age value with an age counter value which is incremented every time a free unit in which no data is recorded, is assigned, and wherein the age value stored is the same as the age counter value of when the data stored together with the age value was recorded.

* * * * *